(12) United States Patent
Aggarwal

(10) Patent No.: US 7,277,893 B2
(45) Date of Patent: Oct. 2, 2007

(54) SYSTEM AND METHOD OF FLEXIBLE DATA REDUCTION FOR ARBITRARY APPLICATIONS

(75) Inventor: Charu C. Aggarwal, Mohegan Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 457 days.

(21) Appl. No.: 10/901,278

(22) Filed: Jul. 28, 2004

(65) Prior Publication Data

US 2006/0026175 A1   Feb. 2, 2006

(51) Int. Cl.
*G06F 17/30* (2006.01)
(52) U.S. Cl. .................. 707/101; 707/2; 707/200
(58) Field of Classification Search .............. 707/1, 707/2, 100, 101, 200, 206
See application file for complete search history.

(56) References Cited

U.S. PATENT DOCUMENTS

| | | | | |
|---|---|---|---|---|
| 6,052,082 | A * | 4/2000 | Hassan et al. | 342/357.04 |
| 6,571,227 | B1 * | 5/2003 | Agrafiotis et al. | 707/100 |
| 6,968,517 | B2 * | 11/2005 | McConaghy | 716/2 |

OTHER PUBLICATIONS

I. T. Jolliffe. Principal Component Analysis, Springer-Verlag, New York, 1986.
S. Kirkpatrick, C. D. Gelatt, M. P. Vecchi. Optimizationby Simulated Annealing. Science (220) (4589): pp. 671-680, 1983.
J. Kleinberg, A. Tomkins. Applications of Linear Algebra in Information Retrieval and Hypertext Analysis. ACM PODS Conference Proceedings, 1999.
C.-H. Papadimitriou, P. Raghavan, H. Tamaki, S. Vempala. Latent Semantic Indexing: A Probabilistic Analysis. ACM PODS Conference Proceedings, pp. 159-168, 1998.
K. V. Ravi Kanth, D. Agrawal, A. Singh. Dimensionality Reduction for Similarity Search in Dynamic Databases. ACM SIGMOD Conference Proceedings, 1998.
A.K.Jain, et al. Data Clustering: A Review, ACM Computing Surveys, vol. 31, No. 3, Sep. 1999.

(Continued)

*Primary Examiner*—Don Wong
*Assistant Examiner*—Marc R Filipczyk
(74) *Attorney, Agent, or Firm*—George A. Willinghan, III; August Law Group, LLC

(57) ABSTRACT

The present invention is directed to the use of an evolutionary algorithm to locate optimal solution subspaces. The evolutionary algorithm uses a point-based coding of the subspace determination problem and searches selectively over the space of possible coded solutions. Each feasible solution to the problem, or individual in the population of feasible solutions, is coded as a string, which facilitates use of the evolutionary algorithm to determine the optimal solution to the fitness function. The fitness of each string is determined by solving the objective function for that string. The resulting fitness value can then be converted to a rank, and all of the members of the population of solutions can be evaluated using selection, crossover, and mutation processes that are applied sequentially and iteratively to the individuals in the population of solutions. The population of solutions is updated as the individuals in the population evolve and converge, that is become increasingly genetically similar to one another. The iterations of selection, crossover and mutation are performed until a desired level of convergence among the individuals in the population of solutions has been achieved.

32 Claims, 6 Drawing Sheets

OTHER PUBLICATIONS

C. Aggarwal. Hierarchical Subspace Sampling:A Unified Framework for High Dimensional Data Reduction, Selectivity Estimation and Nearest Neighbor Search.ACM SIGMOD Conf. 2002.

K. Beyer et al. When is Nearest Neighbors Meaningful?, ICDT Conference, 1999.

K. Chakrabarti, S. Mehrotra. Local Dimensionality Reduction: A New Approach to Indexing High Dimensional Spaces. VLDB Conference Proceedings, 2000.

K. A. De Jong. Analysis of the behaviour of a class of Genetic Adaptive Systems. Ph. D. Dissertation, University of Michigan, Ann Arbor, MI, 1975.

C. Faloutsos, K.-I. Lin. FastMap: A Fast Algorithm for Indexing, Data-Mining and Visualization of Traditional and Multimedia Datasets. ACM SIGMOD Conference Proceedings, 1995.

D. E. Goldberg. Genetic algorithms in search,optimization and machine learning. Addison Wesley, Reading, MA,1989.

A. Hinneburg, C. C. Aggarwal, D. A. Keim. What is the Nearest Neighbor in High Dimensional Spaces? VLDB Conference Proceedings, 2000.

J. H. Holland. Adaptation in Natural and Artificial Systems. University of Michigan Press, Ann Arbor MI 1975.

A. Jain, R. Dubes. Algorithms for Clustering Data.Prentice Hall, New Jersey, 1998.

* cited by examiner

SYSTEM AND METHOD OF FLEXIBLE DATA REDUCTION FOR ARBITRARY APPLICATIONS

STATEMENT REGARDING FEDERALLY SPONSORED RESEARCH

The invention disclosed herein was made with U.S. Government support under Contract No. H98230-04-3-0001 awarded by the U.S. Department of Defense. The U.S. Government has certain rights in this invention.

FIELD OF THE INVENTION

The present invention is directed to systems and methods for generalized dimensionality reduction using arbitrary objective functions.

BACKGROUND OF THE INVENTION

A number of applications, including multimedia and text searching, collaborative filtering and market basket applications, require the use of dimensionality reduction methods. The basic aim in dimensionality reduction methods is to condense data into a few dimensions, i.e. to decrease the size or storage requirements, so that the least amount of information is lost as a result of the reduction process. Examples of dimensionality reduction methods that have been used are described in C. Faloutsos, K. -I. Lin, *FastMap: A Fast Algorithm for Indexing, Data-Mining and Visualization of Traditional and Multimedia Datasets*, ACM SIGMOD Conference Proceedings, 1995, K. V. Ravi Kanth, D. Agrawal, A. Singh, *Dimensionality Reduction for Similarity Search in Dynamic Databases*, ACM SIGMOD Conference Proceedings, 1998, and I. T. Jolliffe, *Principal Component Analysis*, Springer-Verlag, New York, 1986. Many dimensionality reduction methods, for example ZIP files, merely compress the size of an electronic file or database.

In traditional dimensionality reduction processes, a database D is projected onto a subspace of dimensionality l that is represented by a set of l orthonormal vectors V. Specifically, for a given database D an orthonormal set of vectors V is identified so that when database D is projected onto the subspace represented by V, the total amount of variance of the projected database D_V is as large as possible. Such a transformation of the data is useful in a number of content-based retrieval applications, because the distances between pairs of points are approximately preserved by the transformation. Since the use of dimensionality reduction reduces the storage requirement for data, which translates directly into improved performance scalability, and improves the retrieval efficiency of indexing structures, the focus of traditional dimensionality reduction methods is simply to construct a new axis-system, so that the discarded dimensions have the least amount of variance.

While the traditional dimensionality reduction methods have served as useful methods for a number of content-based retrieval applications, these variance-centered approaches may not necessarily be very useful in arbitrary data mining applications. Examples of arbitrary data mining applications include Classification Application and Normalized Similarity Search Application.

Classification Application finds an l-dimensional set of vectors V so that the accuracy of a particular classifier on the projected database representation D_V is as high as possible. The traditional method of using Single Value Decomposition (SVD), however, does not provide the best subspace that optimizes the class discrimination. In fact, the optimal subspace for performing the dimensionality reduction will vary not only with the nature of the class distribution, but also with the particular kind of classifier that is used for the training process. Ideally, a subspace that provides the best discrimination for a particular kind of classifier would be preferred.

Normalized Similarity Search Application finds an l-dimensional set of vectors V so that the average normalized distance of the k closest records to a given target point T in the projected database D_V is as low as possible. The normalization is performed using the average distance to all other points in the projected database.

The qualitative performance of a wide variety of data mining algorithms, for example clustering, classification and outlier detection, are sensitive to the data representation that is used during the execution of these data mining algorithms. Therefore, it is desirable to pick an appropriately constructed or optimized representation of the data in which the corresponding data mining algorithm works most effectively.

Various formulations have been used to construct or to optimize the data representation. Principal Component Analysis (PCA) and SVD are well known techniques used to represent data in a lower dimensional subspace by pruning away those dimensions which result in the least loss of information. These techniques transform the data into a new coordinate system in which higher order, i.e. second order, correlations in the data are minimized. This transformation is done by using a two step process.

In the first step, a d*d covariance matrix is constructed for the data set. Specifically, the entry (i, j) in the matrix is equal to the covariance between the dimensions i and j. The diagonal entries correspond to the variances of the individual dimension attributes. The covariance matrix, C, is positive, semi-definite and can be expressed in the following form:

$$C = P \cdot D \cdot P^T$$

The columns of P represent the orthonormal eigenvectors of C, and the diagonal entries of D are the eigenvalues. These eigenvectors define an orthonormal axis system along which the second order correlations in the data are removed. The corresponding eigenvalues denote the spread or variance along each such newly defined dimension in this orthonormal system. Therefore, the eigenvectors with the largest eigenvalues can be chosen as the subspace in which the data are represented. When the database D is projected along the l vectors in P with the largest eigenvalues, the loss in variance is minimized.

In general, the standard dimensionality reduction problem can be formulated as the following optimization problem. For a given database D, find the l-dimensional subspace represented by the vectors V so that the variance of the projected database D_V is maximized. This formulation of the dimensionality reduction method as an optimization problem is especially useful since it provides a method to define a generic dimensionality reduction problem. Therefore, for a given database D, the l-dimensional subspace represented by the vectors V is found so that the desired objective function, f(D_V), is optimized.

Instead of using a fixed dimensionality l, the problem can be formulated such that the dimensionality of the subspace V is at most l. In such a formulation, when the value of l is chosen equal to the full dimensionality d, this is essentially equivalent to finding any subspace of the data that optimizes the objective function f(D_V).

While the standard dimensionality reduction problem with a variance maximization objective function is optimally solvable using the SVD technique, this is not necessarily true of the more general formulation using an arbitrary objective function. Different instantiations or applications of the objective function provide the solution to a variety of interesting problems, including the Classification Application and the Clustering Application.

In the Classification Application, the subspace V is found such that the effectiveness of a particular classification algorithm (CLA) on the training data D_V is maximized. The optimal subspace depends not only on the data set being used, but also on the particular classification algorithm being used. For example, a single-attribute decision tree algorithm may work well with a subspace representation in which axis-parallel splits tend to separate large and contiguous blocks of classes well. A nearest neighbor classification algorithm may work well in a subspace representation in which the classes get distributed into spherical clusters of small sizes. Thus, in this case, the objective function f(D_V) is defined as the classification accuracy for the particular CLA when the training database D_V is used.

The Clustering Application addresses the problem of unsupervised feature selection as explained, for example, in A. Jain and R. Dubes, *Algorithms for Clustering Data*, Prentice Hall, N.J., 1998. Such methods are typically heuristic techniques that attempt to identify particular dimensions from the original set of attributes that are known to be noisy and non-informative and to use these identified dimensions for the clustering process. The problem is even more difficult for the case when generalized subspaces that are not parallel to the original axis directions are used.

While the standard problem of PCA has an optimal solution which can be expressed in closed form, the above-mentioned problems do not have natural closed form solutions. In fact, in some of the cases, even the objective function to be optimized is not defined in closed form but is computationally defined in terms of an algorithm. Examples include optimizing the effectiveness of a particular kind of clustering or classification algorithm. In such cases, it is not possible to find closed form solutions to the dimensionality reduction problem. In fact, in most cases it is computationally not easy to find the optimal solution, since there can be an infinite number of possible subspaces with arbitrary objective function values. Furthermore, a non-linearity in the nature of the objective function can rule out the possibility of finding simple and efficient algorithms for the task.

SUMMARY OF THE INVENTION

The present invention is directed to the use of an evolutionary algorithm framework for finding optimal solution subspaces. The success of an evolutionary algorithm framework depends upon the ability to pick an effective encoding as well as the ability to construct the proper operations of the evolutionary algorithm. The evolutionary algorithm framework preferably uses a point-based coding of the subspace determination problem and searches selectively over the space of possible coded solutions.

In general, evolutionary algorithms simulate the process of organic evolution or natural selection to solve parameter optimization problems. The basic idea behind an evolutionary search technique is that every solution to an optimization problem is treated as an individual in an evolutionary system. The measure of fitness of each individual is the value of an objective function solution corresponding to that individual. Each individual competes simultaneously with all other individuals from a population of solutions to the objective function or optimization problem.

Evolutionary methods combine the power of a directed random search with the power of solution recombination from a population of solutions. Appropriate operations are defined in order to imitate the genetic processes of selection, recombination and mutation found in an evolutionary system. These procedures are iteratively applied on the population of solutions, until the solutions or individuals in the population converge to an optimal solution.

Each feasible solution to the optimization problem, or individual in the population of solutions, is represented as a string, called a chromosome or genome, in order to facilitate genetic processes such as crossover or mutation. The process of converting the feasible solutions into strings is referred to as coding. A coding of each solution is used that represents the solutions as compactly as possible and that provides for only the relevant portion of the search space being explored during execution of the evolutionary algorithm. The value at each locus on the string is referred to as a gene. The measure of fitness of an individual is evaluated by the fitness function or objective function and is equal to the value of the objective function corresponding to that individual. A higher objective function value corresponds to a better or more desirable fitness value.

Selection, crossover, and mutation processes are applied sequentially and iteratively to the individuals in the population of solutions. As the evolutionary algorithm progresses, the individuals in the population evolve and become increasingly genetically similar to one another. This phenomenon is referred to as convergence. Iterations of selection, crossover and mutation are performed until a desired level of convergence among the individuals in the population of solutions has been achieved. Acceptable or desired levels of convergence vary depending on the nature of the population of solutions and the definition of fitness, i.e. the objective function.

DETAILED DESCRIPTION

Figure 1:
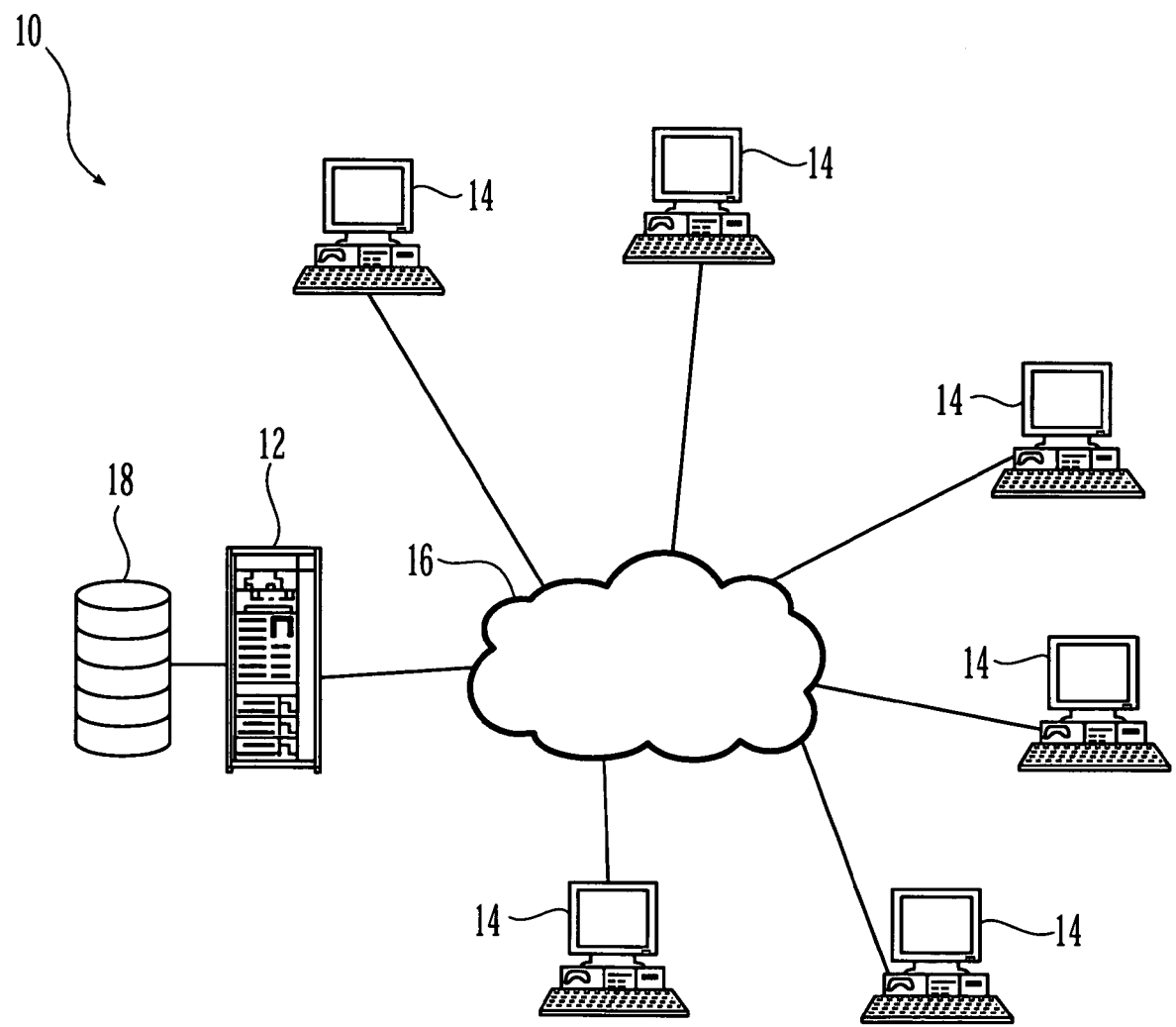
FIG. 1 is a schematic representation of a system in accordance with the present invention.

In FIG. 1, an embodiment of a system 10 in accordance with the present invention is illustrated. In the embodiment as illustrated, the system 10 contains at least one server 12 in communication with a plurality of clients 14 across a network 16. Suitable networks include wide area networks, for example the internet or World Wide Web, local area networks (LAN), secure area networks, virtual private networks (VPN), public switched telephone networks (PSTN) and combinations thereof. The server 12 includes a processor, for example a central processing unit (CPU) and is in communication with one or more electronic computer readable storage mediums 18. In addition to the operating system for the server 12, the storage medium 18 can include the computer readable code which when executed by the processor performs a method of dimensionality reduction in accordance with the present invention. The storage medium 18 can also include the data that are analyzed or accessed by the clients and that are dimensionally reduced. The clients 14 are capable of sending information or data to and receiving information or data from the server 12. Although illustrated as a centralized server system, the dimensionality reduction system of the present invention can also be arranged as a network of distributed servers.

Figure 2:
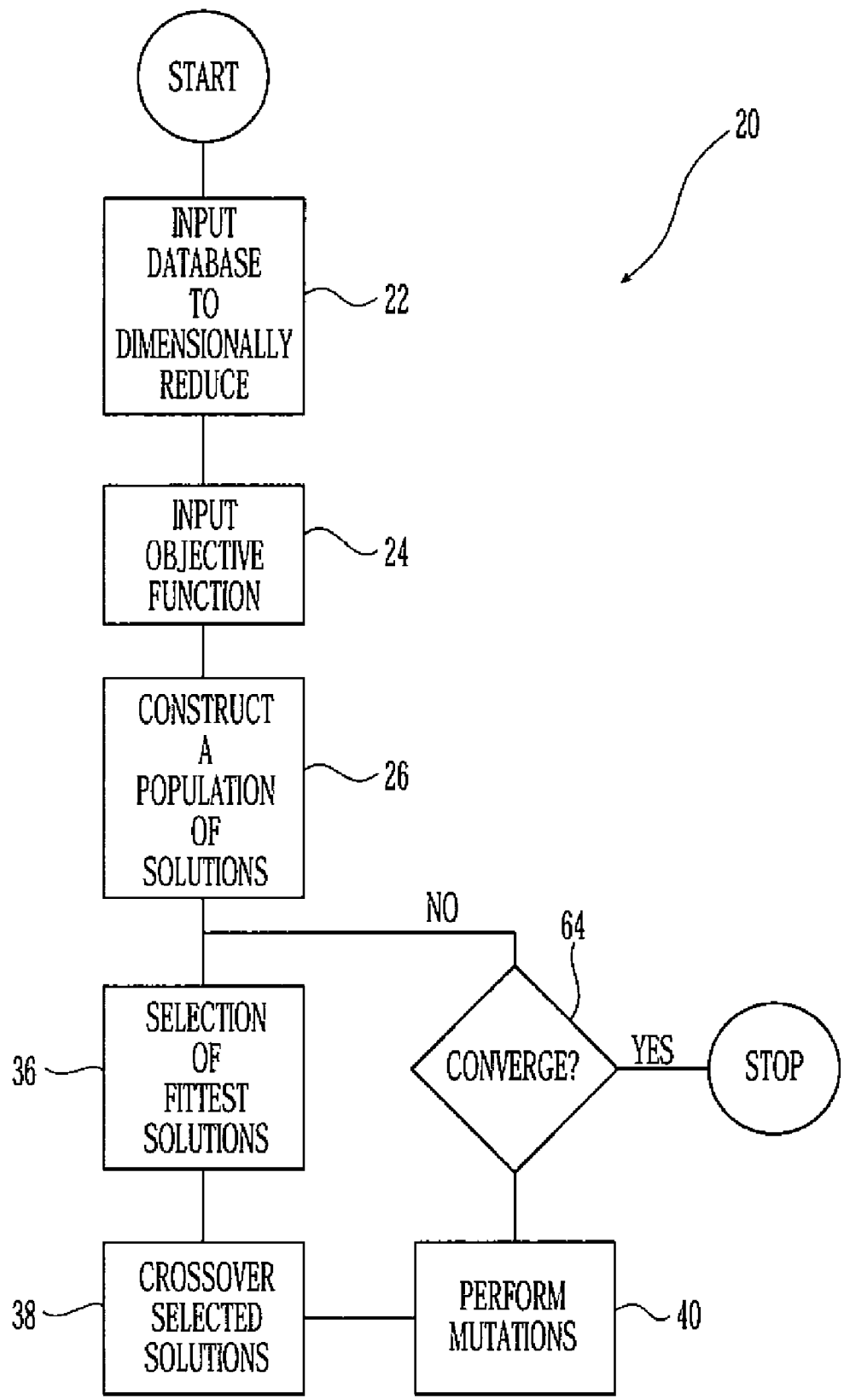
FIG. 2 is a flow chart illustrating an embodiment of a method in accordance with the present invention.

Referring to FIG. 2, an embodiment of a method for the dimensionality reduction of a data set or database 20 in accordance with the present invention is illustrated. As illustrated, an evolutionary algorithm, also referred to as a genetic algorithm, is utilized. Initially, the data set or database D to be dimensionally reduced is identified or inputted 22. The data set contains a plurality of data points having an initial number of dimensions. Therefore the data set requires an initial storage size. In addition to identifying the data set, an objective function, represented generally by f( ), that is to be optimized 24 during the dimensionality reduction process is also identified. In one embodiment, the objective function is inputted by the user. The objective function can be computable in closed form or can be computationally defined as an algorithm, for example a data mining algorithm when it is desired to optimize the behavior of this data mining algorithm. Suitable data mining algorithms include, but are not limited to, clustering, classification or collaborative filtering. In general, the objective function is selected to represent the quality or functionality for which the data in the data set are to be optimized during dimensionality reduction. Therefore, in addition to reducing the size and storage requirements of the data set, the desired functionality of the data set is enhanced. The desired functionalities include, but are not limited to, suitability of the data to detect credit card fraud, to predict or to model meteorological or environmental events, to monitor or to predict economic factors, to monitor or to analyze the performance of a system such as a mechanical or industrial system and to monitor vehicular traffic or air traffic.

Simultaneous dimensionality reduction and functionality enhancement is accomplished by utilizing computation of the objective function during an evolutionary selection procedure to reduce the dimensionality of the data set. As used herein, a multi-dimensional data set is reduced in dimensionality when at least one dimension in the original multi-dimensional data set is eliminated.

Since the functionality desired in the reduced data set is expressed by the objective function, the objective function value for each one of a plurality of solutions derived from the original data set is computed. The objective function value shows the suitability of each solution to provide the desired functionality, i.e. credit card fraud detection, and is referred to as the fitness. Therefore, the measure of fitness of each individual or solution in a population of solutions is the value of the objective function solution corresponding to that individual. For example, a higher objective function value corresponds to a better or more desirable fitness value. The evolutionary algorithm utilizes these fitness values to reduce the dimensionality of the database while simultaneously optimizing the objective function. Optimizing the objective function involves selecting the fittest solution, and dimensionality reduction involves removing data set dimensions. Therefore, simultaneous optimization and reduction can be achieved by eliminating those dimensions in the data set that either do not affect the fitness or are sufficiently repetitive to the desired functionality as expressed by the objective function.

Optimization of a data set becomes increasingly difficult as the number of dimensions in the data set and the number of solutions considered increases. The evolutionary algorithms used in accordance with the present invention facilitate the optimization of multi-dimensional databases and the simultaneous consideration of multiple solutions even as the number of dimensions and the number of solutions increases. In the evolutionary scheme of the present invention, each individual competes simultaneously with all other individuals in the population of solutions to the objective function. Simultaneous competition among all individuals is analogous to the case of organic evolution. Thus, unlike optimization methods such as hill climbing or simulated annealing that deal with single solutions to an optimization problem, see, S. Kirkpatrick, C. D. Gelatt, M. P. Vecchi, *Optimization by Simulated Annealing*, Science (220) (4589), pages 671-680, 1983, evolutionary algorithms work with an entire population of solutions simultaneously rather than a single solution. As a result, evolutionary search methods are inherently more robust than other optimization search methods such as hill-climbing, random search and simulated annealing. In addition to handling multiple dimensions and multiple simultaneous solutions, the evolutionary algorithm approach to dimensionality reduction of the present invention facilitates the use of arbitrary objective functions or objective functions that are computationally defined in the form of algorithms as explained, for example, in D. E. Goldberg, *Genetic Algorithms in Search, Optimization and Machine Learning*, Addison Wesley, Reading, Mass., 1989 and J. H. Holland, *Adaptation in Natural and Artificial Systems*, University of Michigan Press, Ann Arbor, Mich., 1975. The disclosures of these two references are incorporated herein by reference.

Figure 3:
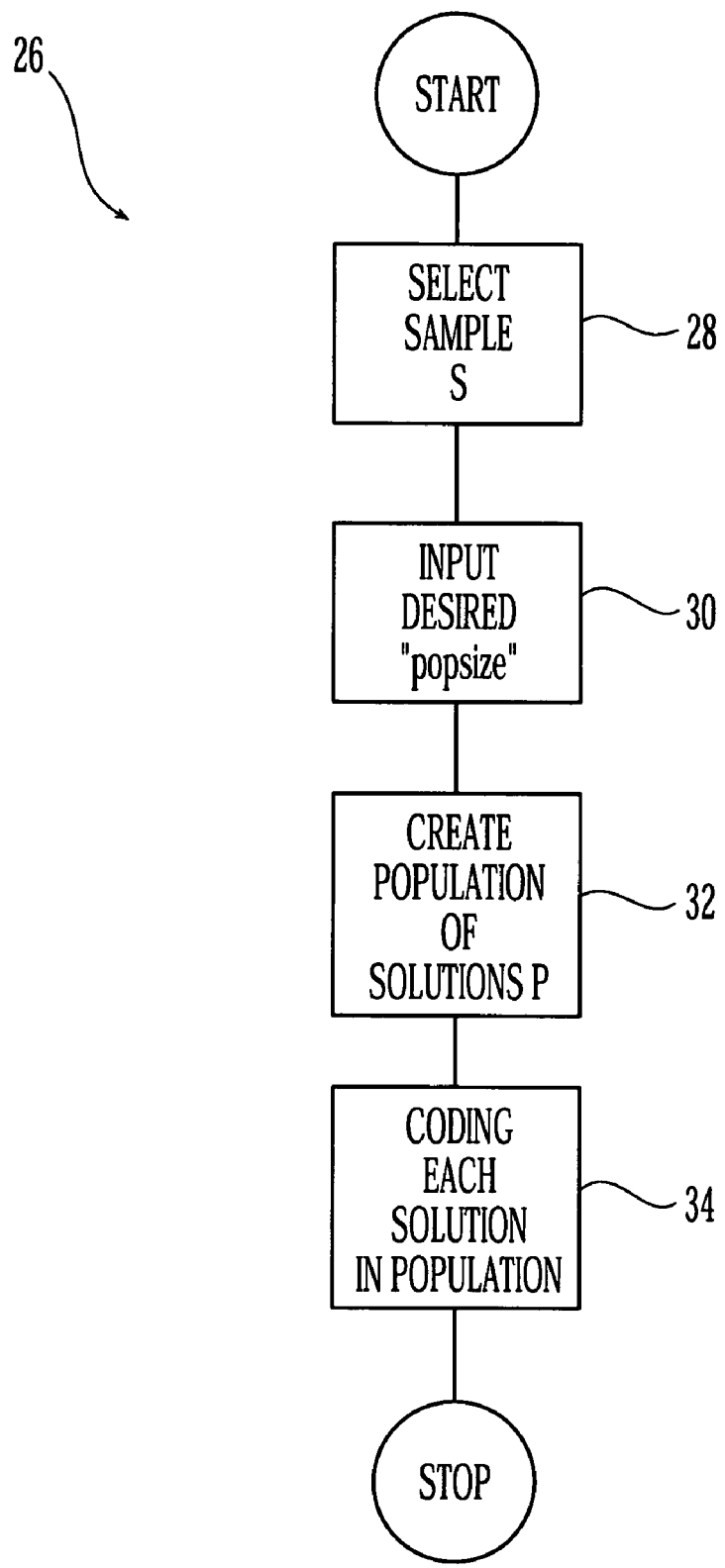
FIG. 3 is a flow chart illustrating an embodiment of the initialization step in the flow chart of FIG. 2.

Since the evolutionary algorithm is applied to a population of solutions, the population of solutions P over which the objective function is to be optimized is constructed 26 (FIG. 2) once the data set to be reduced and the objective function to be optimized are identified. An embodiment of the construction of an initial population of solutions, which is also referred to as an initialization procedure, is illustrated in FIG. 3.

In one embodiment of constructing the populations of solutions, a sample S of data points 28 from which the population of solutions P can be generated is selected. The size of the sample S can be any size desired by the user and can be less than, equal to or greater than the size of the original data set D. In one embodiment, the sample S is chosen as a subset from the original data set D. This embodiment can be used, for example, when it is desirable to choose the population of solutions P from the original distribution of points or data. However, any bias contained in the original data set D can be carried through in the sample S. In another embodiment, a similar solution is achieved without biasing the population of solutions P by the underlying data. In this embodiment, the sample S is chosen as a random sample of points as opposed to being drawn from the original data set D. Therefore, any biases contained in the original data set D are not carried forward into the sample S. Preferably, the sample S is selected as a mixture or combination of data points from the original data set D and from a random sample of points. Regardless of the whether the members of sample S are chosen from database D or are randomly chosen, each member represents a valid input into the objective function that is to be optimized.

In order to create the population of solutions P from the samples, the initial number of solutions or individuals desired in the population of solutions P, often referred to as "popsize", is determined. In one embodiment, the initial size of the population of solutions P is automatically determined based upon the type of objective function and the nature of the data in the data set D. Preferably, the size of the initial population is a user-defined input parameter, and the desired size of the initial population of solutions P is inputted 30.

Having defined a population size, a population of solutions P of the desired size is constructed from the sample S 32. In one embodiment, the population of solutions P is generated by picking a plurality of sets of data points from the samples. Each set of data points is created by repeatedly and randomly picking a plurality of sets of data points from the sample S such that each set of data points defines a hyperplane having the desired dimensionality. In one embodiment, each solution or individual, i.e. each set of data points, in the population of solutions P contains l+1 data points, and each set of l+1 data points defines an l-dimensional hyperplane.

Having defined a population of solutions P with which to evaluate the objective function, genetic processes are applied to the population of solutions P. In order to facilitate application of the genetic processes of the evolutionary algorithm, for example selection, crossover and mutation, each feasible solution to the objective function, or individual in the population of solutions P, is coded. Therefore, after a population of solutions P of the desired size is created, each solution, or hyperplane, in the population is coded 34. Any method of coding that can facilitate the use of the solutions in population of solutions P in the evolutionary algorithm can be used although the choice of coding method can affect the results of the evolutionary algorithm.

Since the method of coding used affects the results of the evolutionary algorithm, an improper choice of coding can produce a solution to the evolutionary algorithm that is an inadequate approximation of the truly optimal solution. In one embodiment, a method of coding each solution is used that represents the solutions as compactly as possible. Since the size of the solution space to be searched increases exponentially with the size of the coding, a compact coding ensures that the evolutionary algorithm has to search over a smaller set of solutions during the iterative search process. Since the solution to the evolutionary algorithm is in the form of an l-dimensional subspace, V, one potential choice is to represent each solution as a concatenation of l different d-dimensional vectors; however, this coding approach requires d*l real numbers for representing a solution, resulting in a large search space, especially when considered in the context of the binary representation of each such real number.

In another embodiment, a method of coding is used so that the portion of the solutions space searched during execution of the evolutionary algorithm is restricted to only those l-dimensional hyperplanes that pass through (l+1) linearly independent points in the underlying data. In most data mining applications, this restriction is quite reasonable since these hyperplanes should be able to provide distinguishing characteristics of the data points. For example, an l-dimensional hyperplane in which all data points project to a single point is not of much use for most applications. Thus, for skewed data, only a small fraction of the feasible hyperplanes are relevant. Preferably, a coding method is selected so that the overall size of the solution space is reduced, and only the relevant portion of the solution space is explored during execution of the evolutionary algorithm.

In one embodiment of coding, in order to minimize the size of the solution search space and to restrict searching to the relevant portions of the solution space, point sampled coding is used. Point sampled hyperplanes are more effective at finding projections that expose the relevant aspects of the data in a variety of applications. Suitable methods for point sampled coding are discussed in C. C. Aggarwal, *Hierarchical Subspace Sampling: A Unified Framework for High Dimensional Data Reduction, Selectivity Estimation and Nearest Neighbor Search*, ACM SIGMOD Conference, 2002, which is incorporated herein by reference in its entirety. In point sampled coding, each solution is represented as a string, called a chromosome or genome. The value at each locus on the string is referred to as a gene. In one embodiment, strings of length (l+1), where each string is a set of (l+1) data points from the sample S, are used. When the (l+1) data points are linearly independent, they define the l-dimensional hyperplane as a feasible solution to the dimensionality reduction problem. Alternatively, the entire data set D can be used as the source of data point identifiers instead of the sample S. However, the use of the sample S is preferable because it results in a greater level of efficiency. In addition as discussed above, coding using the entire data set D results in the population of solutions P, or the set of hyperplanes, being skewed by the underlying data distribution in the data set D. An example of coding in accordance with this embodiment is the traveling salesman problem wherein a route is constructed through a plurality of all of the cities on the salesman's route such that the total mileage traveled along the route is minimized. In particular, each city is to be visited once and only once. In this traveling salesman problem, each solution in the population of solutions is represented as a string containing a sequence of numbers representing the order in which the salesman visits the various cities.

As shown in FIG. 2, once the population of solutions P has been created and coded into a form suitable for use in the evolutionary algorithm, selection 36, crossover 38 and mutation 40 processes are applied sequentially and iteratively to the individuals in the population of solutions P.

Figure 4:
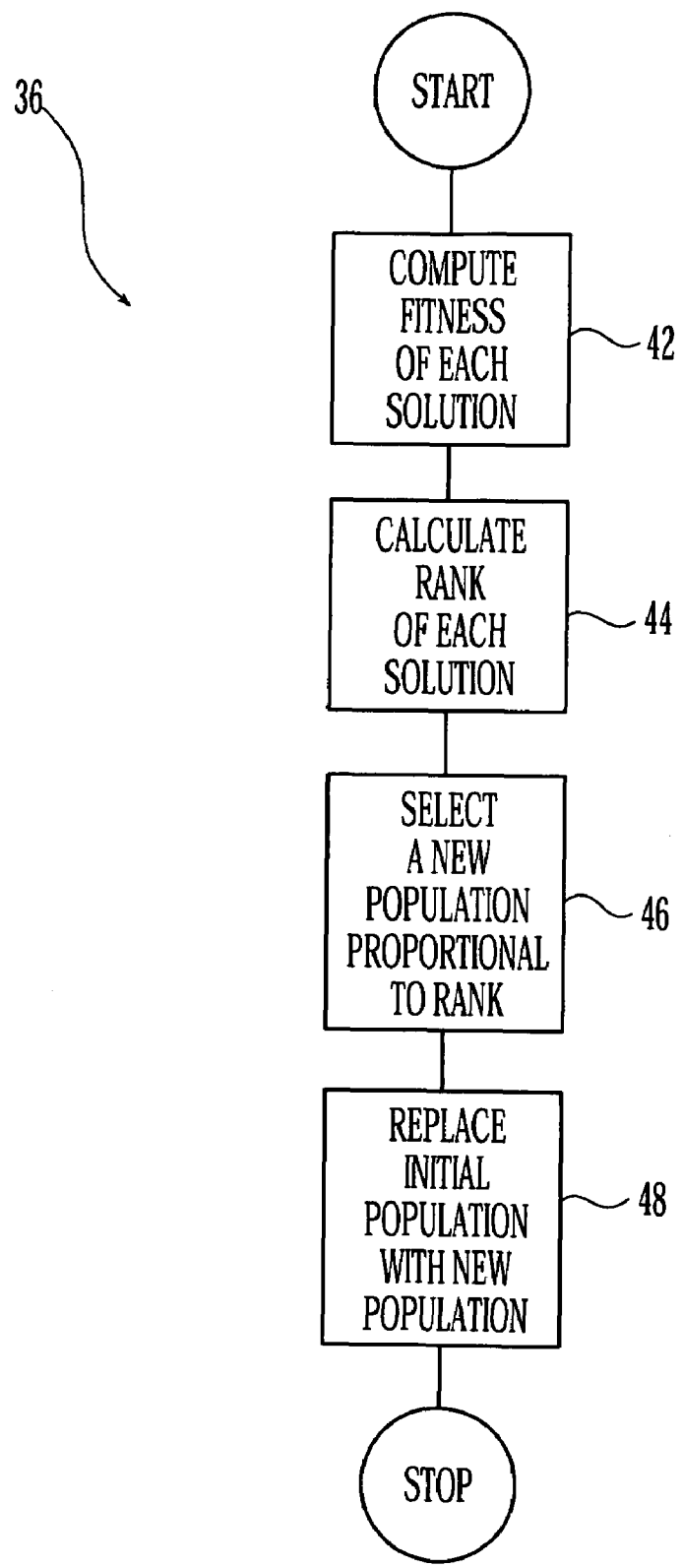
FIG. 4 is a flow chart illustrating an embodiment of the selection step in the flow chart of FIG. 2.

An embodiment of selection 36 is illustrated in FIG. 4. Selection is first conducted on the initial population of solutions P to select a new population of solutions that possess a higher degree of the desired fitness as expressed by the objective function. Therefore, first the fitness of each solution in the population of solutions P is computed 42. In order to compute the fitness, the objective function, f( ), is solved for each one of the members, i, of the population of solutions P. In one embodiment, the objective function is computable in closed form, and the fitness of each solution is equivalent to a computed value of the objective function corresponding to that solution. In another embodiment, the objective function is defined algorithmically, for example as a particular data mining algorithm. In this embodiment, the fitness of each solution is computed by entering the data points from each solution into the objective function to create an algorithm that can be solved in closed form. This closed form algorithm is then solved using data points selected from the data set D. The resulting value corresponds to the fitness of the solution used to create the closed form algorithm. Therefore, each solution can result in a unique closed form algorithm, and uniformity among the resulting fitness values for purpose of comparison is provided by using the same data points from data set D.

The fitness values associated with the solutions are then used to select the new population of solutions. In one embodiment, the new updated population of solutions is selected based directly upon the fitness value of each member of the population of solutions. In another embodiment, a rank-selection mechanism is used to select the new population of solutions. In the rank-selection mechanism, the rank of each member i in the population of solutions P is calculated 42 based upon the member's fitness value. In one embodiment, the rank of each member, i, of the population P is illustrated as r(i), and rank is assigned in a reducing order of fitness. For example, members with the highest fitness value will receive the highest rank, for example r(highest fitness i)=1. Conversely, members with the lowest fitness will receive the lowest rank. For example, in a population of 100 members, the lowest rank r(lowest fitness i)=100.

The new population of solution is then created by repeatedly and randomly selecting individuals from the initial population of solutions where the individuals have been biased or weighted according to rank 46, and the members are weighted inversely to rank. The new population has the same "popsize" as the initial population of solutions P. For example, each member is weighted by |P|–r(i) where |P| is equal to "popsize" and r(i) is the rank of member i. Therefore, for "popsize"=100, members with r(i)=1 will have a weight of 99, and members with r(i)=99 will have a weight of 1. The entire initial population of solutions is randomly sampled 100 times to produce the new population of solutions. Therefore, the likelihood that any one solution is chosen on each sampling is proportional to its weight. For example, the highest weighted members are 99 times more likely to be selected than the lowest weighted members. Therefore, the new population of solutions will most likely contain multiple copies of the solutions having the highest fitness, and the solutions having the lowest fitness are least likely to be selected through to the new population of solutions and in fact may be removed from the new population of solutions. Thus the overall fitness of the new population of solutions will increase as a result of selection. Examples of suitable rank-selection mechanisms are described in D. E. Goldberg, *Genetic Algorithms in Search, Optimization and Machine Learning*, Addison Wesley, Reading, Mass., 1989, is used. The entire disclosure of this reference is incorporated herein by reference.

In one embodiment, in order to ensure that the least fit solutions are not prematurely removed from the population as a result of selection, each member is weighted by max {rank_min, |P|–r(i)}, where the value of rank_min is chosen to be a lowest threshold value. In one embodiment, the lowest threshold value is selected to be the lowest quarter percentile so that the lowest weighting of any member is 25. Once the new population is selected, the initial population of solutions is replaced with the new population of solutions 48, completing the selection process.

Figure 5:
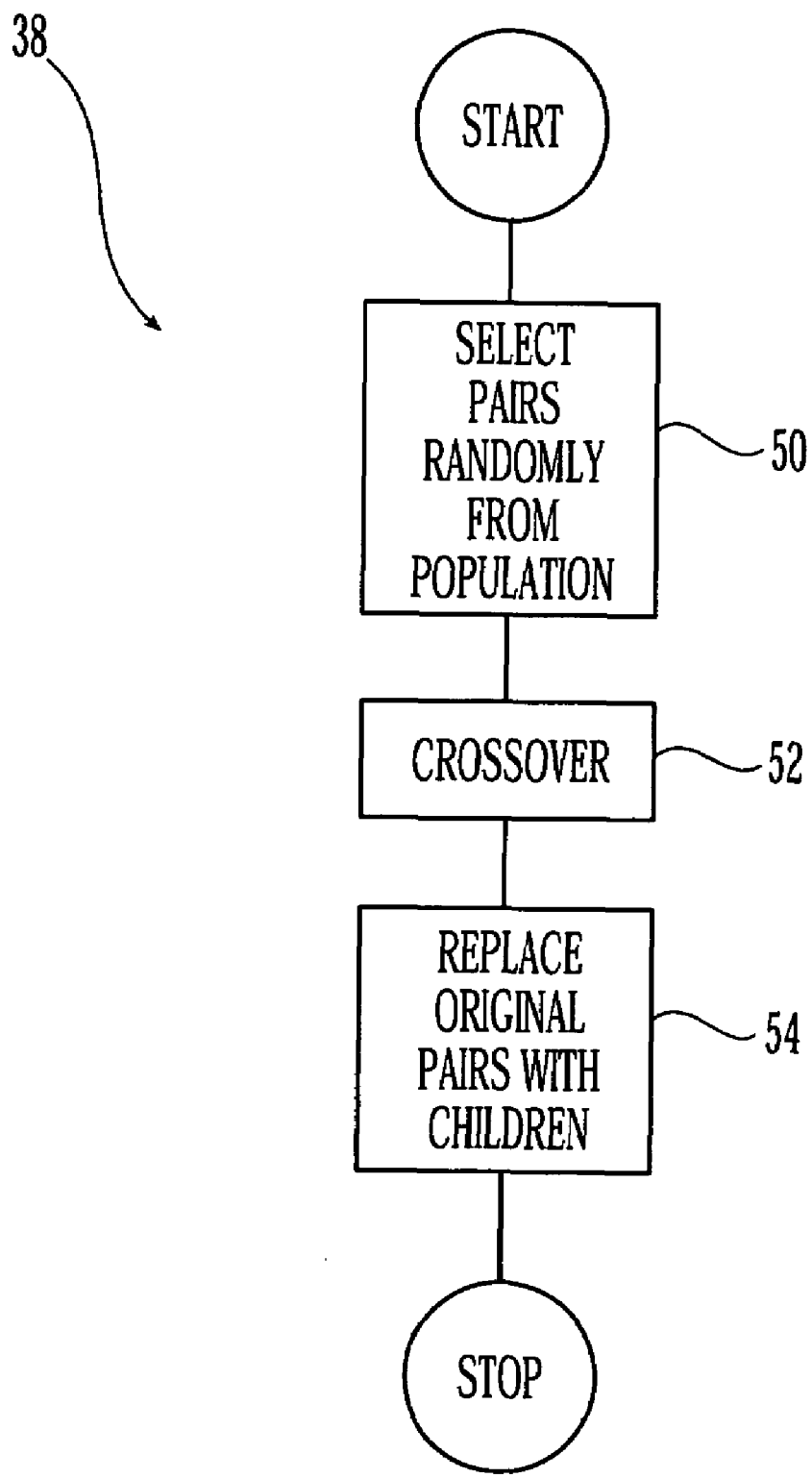
FIG. 5 is a flow chart illustrating an embodiment of the crossover step in the flow chart of FIG. 2.

After the selection process, a crossover mechanism is applied 38 on the new population of solutions in order to combine pairs of solutions from the population. Crossover is analogous to breeding in an organic system, and the selection mechanism insures that only the fitness members from the initial population of solutions are available for breeding. An embodiment of the crossover mechanism is illustrated in FIG. 5. In crossover, at least one pair of members of the population are selected randomly 50 from the total population of solutions. A plurality of pairs can be selected and processed at the same time for crossover, or the process of FIG. 5 can be performed a plurality of times with a single pair of members being selected each time. The total number of pairings can vary depending on the current convergence or homogeneity of the population of solutions or can be a constant, pre-defined number of pairings. In one embodiment, the number of pairings is equal to from about 40% to about 60%, preferably about 50%, of the number of members in the population. Not all of the solutions may be subject to crossover. In another embodiment, pairings are conducted until each one of the members of the population has been selected or paired at least once.

In one embodiment, for each selected pair of solutions a gene-by-gene or point-by-point comparison of the solution strings is conducted. Each set of compared genes can either be swapped or left in place. In order to determine whether or not to swap the genes, an unbiased mechanism having a probability of ½, for example a coin flip, is used. Therefore, about 50% of the time a gene from one solution string is swapped with a corresponding gene from the paired solutions string. The gene-by-gene comparison yields a set of two children solution strings from the selected pair of solutions, and the selected pair of solutions are replaced by the children solutions in the population of solutions.

In another embodiment, the (l+1) data points from each solution in the pair of solutions are combined into a common pool or basket of (2l+2) data points. This set of (2l+2) data points may contain repetitions. The children strings of the original pair are created by randomly partitioning the (2l+2) data points into two sets of (l+1) data points. Again, a random selection mechanism such as an unbiased coin flip can be used for partitioning. Not all of the data points may be selected, and some of the data points can be selected more than once. In addition, since the data points are selected at random, the children can potentially contain data point repetitions, resulting in string solutions that are less than l-dimensional. Such solutions are automatically selected out by the evolutionary algorithm, when only subspaces of dimensionality exactly l are required. If the chosen child is less than l-dimensional, a substitute child is selected from the original (2l+2) data points that is l-dimensional. Alternatively, one of the original solutions form the pair of solutions is chosen, either randomly or using fitness or rank, to replace that child.

When $l\_1$ of the data points in a child solution are drawn from one of the two parents, that parent and child hyperplane share at least an $(l\_1-1)$-dimensional subspace in common. Often, this embodiment of recombination results in a child solution that has subspaces in common with both parents. Therefore, the fitness of each child can depend on the fitness of the subspace that is has in common with each parent. Some of these subspaces may be fitter than others. Therefore, some children may have a higher fitness than others. Recognizing this potential disparity in resulting fitness, the quality of the crossover is further improved by performing an additional optimization mechanism during crossover. A plurality or population of children is created for each pair of solutions, and the fitness of each child is calculated. The two fittest children are then selected to replace the original pair of solutions. For example, from the basket of (2l+2) values created for each pairing of solution strings, a plurality, k', of distinct pairs of children are created, where $k' \geq 1$. Of these k' distinct pairs of children, the child pair containing the fittest children from all 2k' possible children are selected. Once the children pairs have been selected, the old strings are replaced with the new strings 54.

The crossover process in accordance with the present invention is not present in methods such as simulated annealing. The ability to create solutions that combine characteristics from two solutions of good quality yields even better solutions than can be obtained from the neighborhood search of either solution. For the particular case of the dimensionality reduction problem, it is preferred to combine the two solution subspaces in such a way so that the children strings contain large subspaces in common with the parent strings. Coding in accordance with the present invention facilitates a crossover operation that creates a subspace that combines features from both subspaces.

Figure 6:
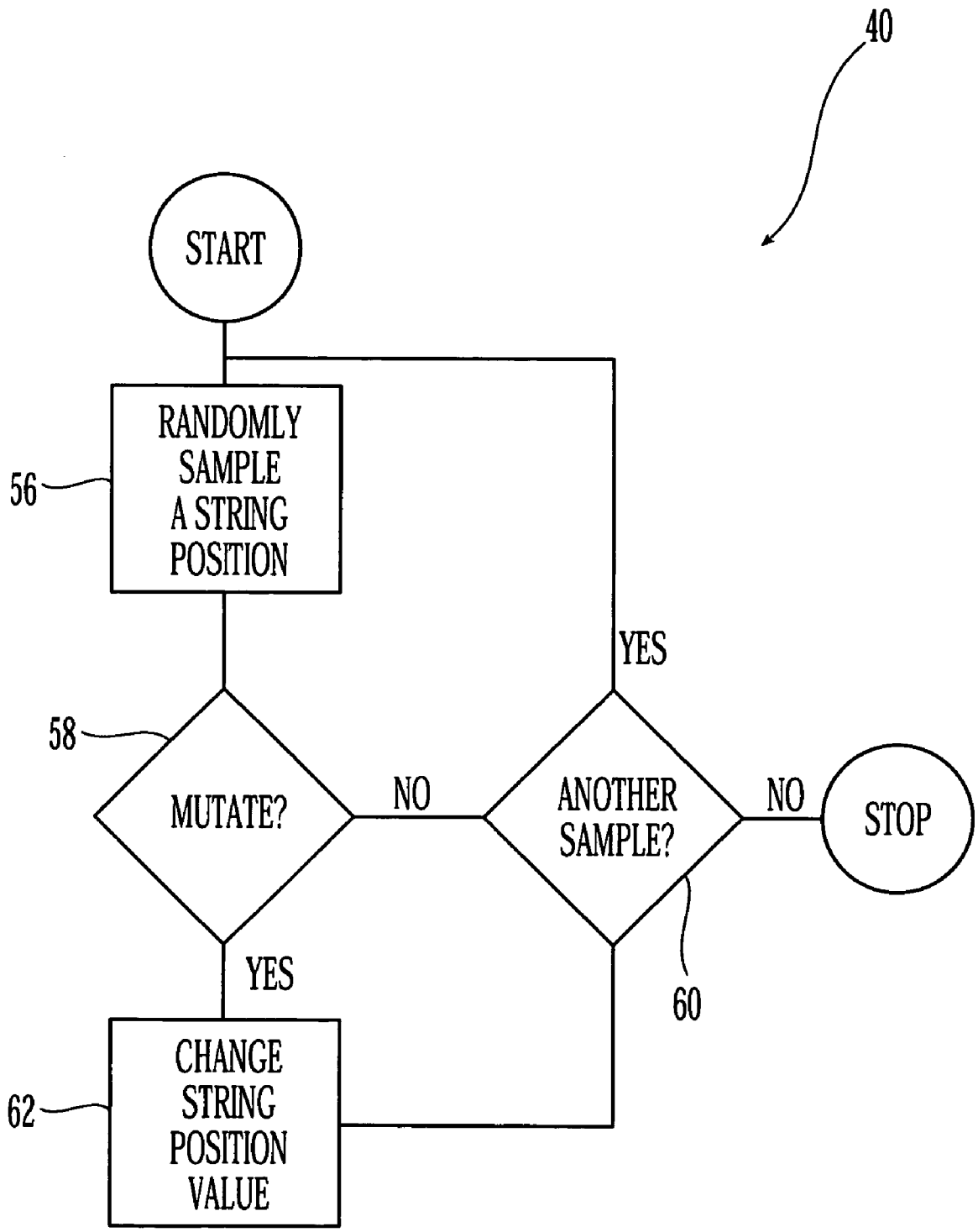
FIG. 6 is a flow chart illustrating an embodiment of the mutation step in the flow chart of FIG. 2.

Following crossover, a mutation operation 40 is performed on the population of solutions. An embodiment of the mutation operation is illustrated in FIG. 6. Mutation simulates the random mutations that occur in natural evolutionary systems. In order to perform the mutation, a sample position or data point on one of the strings in the population of solutions is randomly selected 56. Once selected, a determination is made about whether or not to mutate or change the value of that position 58. This determination is made based upon the rate of mutation desired. Suitable rates of mutation range from about 0.005% up to about 0.1%. A preferred range of mutation is about 0.01%. For example, a biased coin is flipped that has a probability of selecting mutation, $p_{mutate}$, that is equal to the desired rate of mutation, e.g. $p_{mutate}=0.01\%$. When the flip results in a mutation selection, the selected string position is modified to a randomly picked data point from the sample S 62. Alternatively, the data point can be randomly picked from the data set D. Following the mutation determination for the randomly selected data point, a decision is made on whether or not to sample any other string positions 60. If no other positions are to be sample, then mutation is stopped, otherwise another random sample is selected 56. The number of positions randomly selected is user-defined. Mutation ensures that the changed subspace is quite similar to the original subspaces, but with minor variations once in a while. When the mutations improve the quality of the objective function, strings containing these mutations are likely to be retained or replicated during subsequent selection procedures. Conversely, mutations that do not improve the quality of the objective function will likely be dropped during selection.

As the evolutionary algorithm 20 progresses, the individuals in the population evolve, become increasingly suitable for the desired functionality and become increasingly genetically similar to one another. This phenomenon is referred to as convergence. Iterations of selection, crossover and mutation are performed until a desired level of convergence among the individuals in the population of solutions has been achieved. Acceptable or desired levels of convergence vary depending on the nature of the population of solutions and the definition of fitness, i.e. the objective function. In K. A. De Jong, *Analysis of the Behavior of a Class of Genetic Adaptive Systems*, Ph. D. Dissertation, University of Michigan, Ann Arbor, Mich., 1975, for example, convergence of a gene, defined on a gene-by-gene basis, is the point when about 95% of the individuals in the population of solutions have the same value for that gene, and the entire population of solutions has converged when all genes have converged. Other suitable convergences range from about 90% up to about 99%.

Therefore, after each iteration of selection, crossover and mutation, the population of solutions is checked against the desired termination criterion or convergence threshold 64. If the termination criterion is satisfied, the iterations are stopped. If the termination criterion is not satisfied, then another round of iterations 36, 38, 40 is performed with the current population of solutions serving as the initial population of solutions for the subsequent iteration. Therefore, selection, crossover and mutation operations are performed on the population until the termination criterion is satisfied.

As with coding, the selection, crossover and mutation operations used affect the evolutionary algorithm. An improper choice of coding, selection, crossover or mutation can produce a solution that is an inadequate approximation of the truly optimal solution.

While traditional dimensionality reduction methods can be effective for preserving the variance in the data, it is often desirable to reduce the data differently in order to improve the effectiveness of different kinds of data mining algorithms such as clustering, classification or collaborative filtering. The method for dimensionality reduction with arbitrary objective functions of the present invention improves over traditional reduction methods by both reducing the size of the database and improving the functionality of the database in the reduced form. This functionality is expressed as the objective function over which the database has been optimized. The method of the present invention is very efficient, and scales well with data set size and dimensionality.

While it is apparent that the illustrative embodiments of the invention disclosed herein fulfill the objectives of the present invention, it is appreciated that numerous modifications and other embodiments may be devised by those skilled in the art. Additionally, feature(s) and/or element(s) from any embodiment may be used singly or in combination with other embodiment(s). Therefore, it will be understood that the appended claims are intended to cover all such modifications and embodiments, which would come within the spirit and scope of the present invention.

What is claimed is:

1. A method for reducing dimensionality in a data set, the method comprising:
   identifying a data set to be reduced, the data set having an initial dimensionality;
   identifying an objective function to be optimized, the objective function expressing a desired functionality in the data set; and
   utilizing the objective function in an evolutionary algorithm to simultaneously reduce the dimensionality of the data set and enhance the desired functionality of the data set, by constructing a population of solutions to the objective function over which the objective function is to be optimized and iteratively applying selection, crossover and mutation processes to the population of solutions.

2. The method of claim 1, further comprising determining an initial number of solutions for the population of solutions.

3. The method of claim 1, wherein the step of constructing a population of solutions comprises picking a plurality of sets of data points from a sample of data points, the sample of data points comprising data points form the data set, a random sample of data points or combinations thereof, and each set of data points corresponds to a solution in population of solutions.

4. The method of claim 3, wherein each set of data points defines a hyperplane with dimensionality equal to the reduced dimensionality of the data set.

5. The method of claim 1, further comprising coding each solution in the population of solutions to facilitate utilization of the objective function in the evolutionary algorithm.

6. The method of claim 5, wherein the step of coding each solution comprises using point sampled coding wherein each solution comprises a set of data points and is coded as a string comprising the corresponding set of data points.

7. The method of claim 1, wherein the selection process produces a new population of solutions and comprises:
   computing fitness values for each solution in the population of solutions; and selecting the new population of solutions based upon the fitness values associated with each solution.

8. The method of claim 7, wherein the objective function is computable in closed form and the step of computing the fitness of each solution comprises using each solutions to compute a corresponding value of the objective function.

9. The method of claim 7, wherein the objective function is defined algorithmically and the step of computing the fitness of each solution comprises using each solution to compute a corresponding objective function in closed form and computing a value for the corresponding objective function using a sample of data selected from the data set.

10. The method of claim 7, wherein the selection process further comprises calculating a rank for each solution based upon the fitness value corresponding to each solution; and
weighting each solution based upon the calculated rank wherein a highest rank is associated with a greatest weight and each solution is given at least a predetermined minimum rank; and
the step of selecting the new population of solutions further comprises randomly selecting the new population of solutions from the weighted solutions.

11. The method of claim 7, wherein the crossover process comprises:
selecting at least one pair of solutions randomly;
conducting a point-by-point comparison of the data points in the selected pair of solutions;
determining whether or not to swap the compared data points using an unbiased mechanism that yields a probability of swapping of ½;
creating two children solutions from the pair of selected solutions by updating the selected pair in accordance with the determined swapping probability; and
replacing the selected pair of solutions with the children solutions in the population of solutions.

12. The method of claim 7, wherein the crossover process comprises:
selecting at least one pair of solutions randomly;
combining all data points from the pair of solutions into a common pool;
creating two children solutions by randomly partitioning the common pool into two new sets of data points; and
replacing the selected pair of solutions with the children solutions in the population of solutions.

13. The method of claim 12, further comprising:
creating a plurality of children solutions by partitioning the common pool of data points;
calculating a fitness value for each child solution; and
selecting the two children solutions having the greatest fitness value.

14. The method of claim 1, wherein the process of mutation comprises:
selecting a data point randomly from a solution in the population of solutions;
determining whether or not to exchange the selected data point with a substitute data point randomly selected from the set of data using a mechanism that yields a desired rate of mutation.

15. The method of claim 14, wherein the desired rate of mutation is about 0.01%.

16. The method of claim 1, further comprising checking convergence in the population of solutions following each iteration of selection, crossover and mutation; and
stopping the iterations when the convergence is at least 95%.

17. A computer readable medium containing a computer executable code that when read by a computer causes the computer to perform a method for reducing dimensionality in a data set, the method comprising:
identifying a data set to be reduced, the data set having an initial dimensionality;
identifying an objective function to be optimized, the objective function expressing a desired functionality in the data set; and
utilizing the objective function in an evolutionary algorithm to simultaneously reduce the dimensionality of the data set and enhance the desired functionality of the data set, by constructing a population of solutions to the objective function over which the objective function is to be optimized and iteratively applying selection, crossover and mutation processes to the population of solutions.

18. The computer readable medium of claim 17, further comprising determining an initial number of solutions for the population of solutions.

19. The computer readable medium of claim 17, wherein the step of constructing a population of solutions comprises picking a plurality of sets of data points from a sample of data points, the sample of data points comprising data points form the data set, a random sample of data points or combinations thereof, and each set of data points corresponds to a solution in population of solutions.

20. The computer readable medium of claim 19, wherein each set of data points defines a hyperplane with dimensionality equal to the reduced dimensionality of the data set.

21. The computer readable medium of claim 17, further comprising coding each solution in the population of solutions to facilitate utilization of the objective function in the evolutionary algorithm.

22. The computer readable medium of claim 21, wherein the step of coding each solution comprises using point sampled coding wherein each solution comprises a set of data points and is coded as a string comprising the corresponding set of data points.

23. The computer readable medium of claim 17, wherein the selection process produces a new population of solutions and comprises:
computing fitness values for each solution in the population of solutions; and
selecting the new population of solutions based upon the fitness values associated with each solution.

24. The computer readable medium of claim 23, wherein the objective function is computable in closed form and the step of computing the fitness of each solution comprises using each solutions to compute a corresponding value of the objective function.

25. The computer readable medium of claim 23, wherein the objective function is defined algorithmically and the step of computing the fitness of each solution comprises using each solution to compute a corresponding objective function in closed form and computing a value for the corresponding objective function using a sample of data selected from the data set.

26. The computer readable medium of claim 23, wherein the selection process further comprises calculating a rank for each solution based upon the fitness value corresponding to each solution; and
weighting each solution based upon the calculated rank wherein a highest rank is associated with a greatest weight and each solution is given at least a predetermined minimum rank; and the step of selecting the new population of solutions further comprises randomly selecting the new population of solutions from the weighted solutions.

27. The computer readable medium of claim 23, wherein the crossover process comprises:
   selecting at least one pair of solutions randomly;
   conducting a point-by-point comparison of the data points in the selected pair of solutions;
   determining whether or not to swap the compared data points using an unbiased mechanism that yields a probability of swapping of ½;
   creating two children solutions from the pair of selected solutions by updating the selected pair in accordance with the determined swapping probability; and
   replacing the selected pair of solutions with the children solutions in the population of solutions.

28. The computer readable medium of claim 23, wherein the crossover process comprises:
   selecting at least one pair of solutions randomly;
   combining all data points from the pair of solutions into a common pool;
   creating two children solutions by randomly partitioning the common pool into two new sets of data points; and
   replacing the selected pair of solutions with the children solutions in the population of solutions.

29. The computer readable medium of claim 28, further comprising:
   creating a plurality of children solutions by partitioning the common pool of data points;
   calculating a fitness value for each child solution; and
   selecting the two children solutions having the greatest fitness value.

30. The computer readable medium of claim 17, wherein the process of mutation comprises:
   selecting a data point randomly from a solution in the population of solutions;
   determining whether or not to exchange the selected data point with a substitute data point randomly selected from the set of data using a mechanism that yields a desired rate of mutation.

31. The computer readable medium of claim 30, wherein the desired rate of mutation is about 0.01%.

32. The computer readable medium of claim 17, further comprising
   checking convergence in the population of solutions following each iteration of selection, crossover and mutation; and
   stopping the iterations when the convergence is at least 95%.

* * * * *